United States Patent
Ma et al.

(10) Patent No.: US 10,177,776 B1
(45) Date of Patent: Jan. 8, 2019

(54) NOISE MITIGATING QUANTIZER FOR REDUCING NONLINEAR DISTORTION IN DIGITAL SIGNAL TRANSMISSION

(71) Applicant: Mitsubishi Electric Research Laboratories, Inc., Cambridge, MA (US)

(72) Inventors: Rui Ma, Lexington, MA (US); Omer Tanovic, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 15/669,434

(22) Filed: Aug. 4, 2017

(51) Int. Cl.
*H03M 1/18* (2006.01)
*H03M 1/08* (2006.01)
*H04L 25/49* (2006.01)

(52) U.S. Cl.
CPC ...... *H03M 1/0854* (2013.01); *H04L 25/4902* (2013.01); *H04L 25/4927* (2013.01)

(58) Field of Classification Search
CPC ............. H03M 1/0854; H04L 25/4902; H04L 25/4927
See application file for complete search history.

(56) References Cited

U.S. PATENT DOCUMENTS

| | | | | |
|---|---|---|---|---|
| 7,142,819 B1 * | 11/2006 | Kang | ................ | H03F 3/2173 455/63.3 |
| 8,374,233 B2 * | 2/2013 | Singerl | ................ | H03K 7/08 330/10 |
| 8,953,670 B1 * | 2/2015 | Ma | ................ | H04B 1/0475 375/238 |
| 2008/0252392 A1 * | 10/2008 | Midya | ................ | H03F 3/217 332/127 |
| 2009/0190651 A1 * | 7/2009 | Yoneya | ................ | H03F 3/217 375/238 |
| 2011/0064245 A1 | 3/2011 | Kim et al. | | |

OTHER PUBLICATIONS

Nuyts et al., "A fully digital delay line based GHz range multimode transmitter front end in 65 nm CMOS." IEEE Journal of Solid State Circuits, vol. 47, No. 7, Jul. 1, 2012. pp. 1681-1692.
Zhu et al., "A 5 level discrete time power encoder with measured coding efficiency of 70% for 20 MHz LTE digital transmitter," 2014 IEEE MTT S International Microwave Symposium IEEE, Jun. 1, 2014, pp. 1-3.

\* cited by examiner

*Primary Examiner* — Dac Ha
(74) *Attorney, Agent, or Firm* — Gene Vinokur; James McAleenan; Hironori Tsukamoto

(57) ABSTRACT

A distortion mitigation quantizer circuit includes a pre-quantizer to generate a first quantized signal having L output signal levels from an input signal and a digital pulse-width-modulation (PWM) circuit to modulate the first quantized signal using M modulating carriers with PWM carrier frequency $f_p$ and according to an over sampling ratio (OSR) N in order to generate a second quantized signal. In this case, a number of the modulating carriers M is substantially equal to twice L/N.

20 Claims, 9 Drawing Sheets

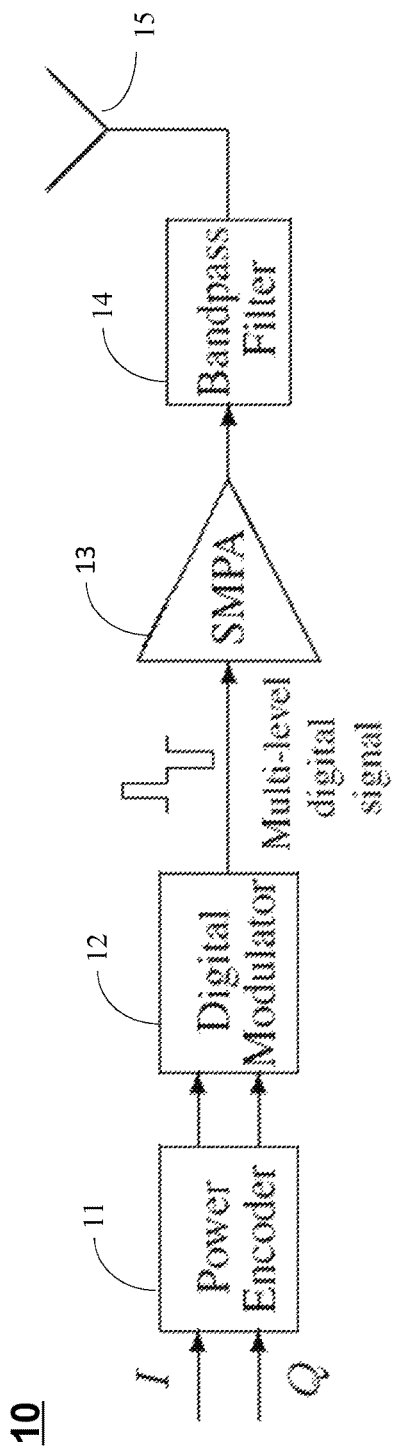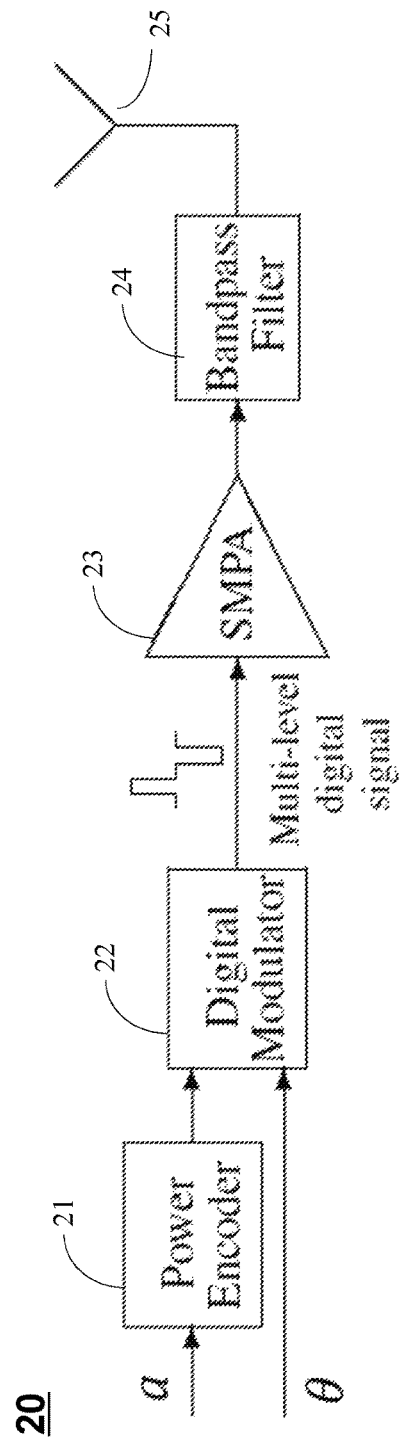
FIG. 1A
FIG. 1B

NOISE MITIGATING QUANTIZER FOR REDUCING NONLINEAR DISTORTION IN DIGITAL SIGNAL TRANSMISSION

FIELD OF THE INVENTION

This invention relates to a noise mitigating quantizer for reducing signal distortion in digital pulse-width modulation circuits, which may be used for digital wireless transmission.

BACKGROUND OF THE INVENTION

In modern communication systems, a demand for high data transmission rates has resulted in the use of advanced signal standards for enhanced spectral efficiency. All-digital transmitter architectures (ADT), which employ radio-frequency (RF) power amplifiers (PA) in switched-mode operation, have shown a promising potential of achieving high power efficiency while maintaining good linearity of the transmitted signals. It is very challenging to drive switched-mode power amplifiers (SMPA) with high resolution RF input signals, and reduction of amplitude resolution of the SMPA input is needed in practice to adjust for switched-mode operation. Reduction of resolution is commonly performed through a procedure called power encoding, where a high resolution input signal is converted into a multi-level piecewise constant SMPA driving signal.

Pulse width modulation (PWM) is a technique used to reduce resolution of a PA driving signal. PWM maps a baseband input signal into a digital pulse train, where the amplitude information of the input signal is encoded into time-varying width of the pulses. In this case, an output signal of PWM includes an infinite number of modulated harmonics as noise components. Furthermore, when PWM is digitally implemented, additional in-band noise is created due to the spectral aliasing effects caused by time-sampling nature of the input and output signals. In general, these noise components are reduced by adjusting parameters used in the circuit, such as a sampling ratio of the input signal. However, such a noise reduction scheme is varied for circuit designs, and there is no consistent method to reduce the noise components of the modulated harmonics in digital signal transmission.

Thus, there is a need to provide an advanced noise shaping quantizing method and architecture for digital wireless transmission while maintaining high efficiency.

SUMMARY OF THE INVENTION

Some embodiments are based on recognition that the spectral aliasing effects manifest in time-domain as additional (hidden) quantization of the input baseband signal, where PWM does not perceive the true input signal but a quantized version of it. This hidden quantization is an inherent property of all digital PWM schemes, and is due to the displacement of switching instants caused by sampling of a digitized pulsed PWM output signal. In other words, the major spectral distortion is entirely due to the hidden quantization of a digital PWM input signal, and if the input signal into the digital PWM were properly quantized, it is expected that no additional aliasing distortion is introduced and the output of digital PWM could become substantially aliasing-free.

In order to substantially minimize the spectral distortion noise of a digital pulse-width-modulation (PWM) system, the digital PWM system includes a pre-quantizer to generate a first quantized signal having L output signal levels from an input signal of arbitrary resolution; and a digital pulse-width-modulation (PWM) circuit to modulate the first quantized signal using M modulating carriers with PWM carrier frequency $f_p$ and according to an over sampling ratio (OSR) N in order to generate a second quantized signal, wherein a number of the modulating carriers M is substantially equal to twice L/N.

Another embodiment discloses a method for mitigating distortion noises in digital pulse-width modulation circuits, which may be used for digital signal transmission. The method includes steps of generating a first quantized signal having L output signal levels from an input signal; and using digital pulse-width-modulation (PWM) circuit to modulate the first quantized signal using M modulating carriers with PWM carrier frequency $f_p$ and according to an over sampling ratio (OSR) N in order to generate a second quantized signal, wherein a number of the modulating carriers M is substantially equal to twice L/N.

Yet, further, another embodiment discloses a digital transmitter for mitigating distortion noises in digital pulse-width modulation circuits, which may be used for signal transmission. The digital transmitter includes a power encoder to generate an input signal from input-data (in-phase, quadrature components of the input signal or the magnitude of the input signal) comprising of: a pre-quantizer to generate a first quantized signal having L output signal levels from the input signal; a digital pulse-width-modulation (PWM) circuit to modulate the first quantized signal using M modulating carriers with PWM carrier frequency $f_p$ and according to an over sampling ratio (OSR) N in order to generate a second quantized signal, wherein a number of the modulating carriers M is substantially equal to twice L/N;

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 1A is a diagram illustrating an example of an all-digital transmitter based on quadrature modulated ADT architecture, according to embodiments of the present invention;

FIG. 1B is a diagram illustrating an example of an all-digital transmitter based on burst-mode ADT architecture, according to embodiments of the present invention;

Figures 2A, 2B:
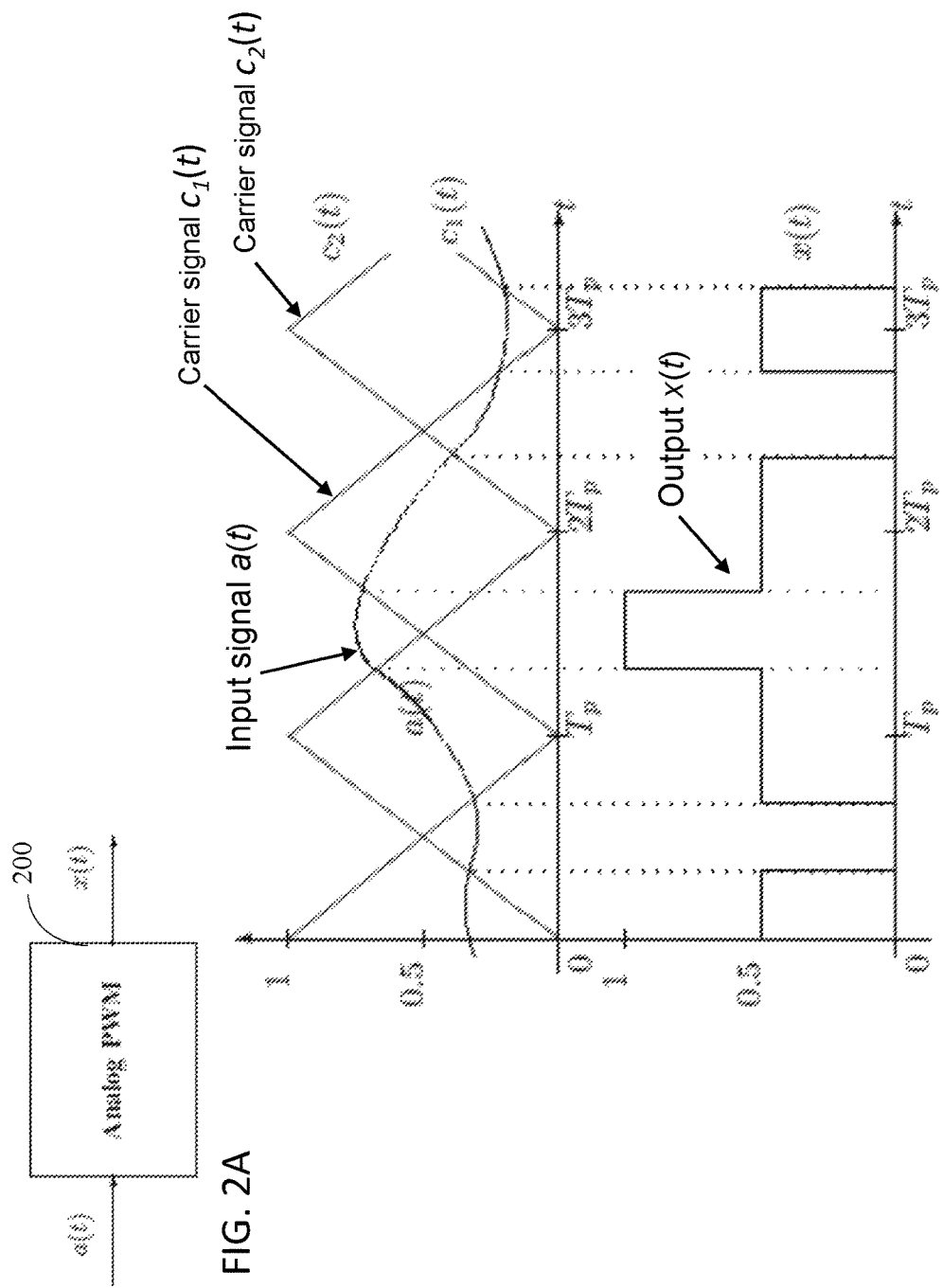
FIG. 2A is a block diagram indicating an example of an analog PWM system.
FIG. 2B is a diagram illustrating an example of time domain waveforms of input and output signals.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION OF THE PREFERRED EMBODIMENTS

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention.

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof When implemented in software, firmware, middleware or microcode, the program code or code segments to perform the necessary tasks may be stored in a machine readable medium. A processor(s) may perform the necessary tasks.

It would be noted that a circuit may be reffered to as a system, and a PWM carrier signal may be reffered to as a PWM reference signal, and PWM carrier frequency may be reffered to as a PWM reference frequency, and PWM threshold value can be reffered to as a constant PWM reference signal.

Overview

Embodiments of the present invention are directed to providing a noise mitigating quantizer for reducing signal distortion in digital pulse-width modulation circuits, which may be used for digital wireless transmission.

The present disclosure is based on the recognition that the spectral aliasing effects manifest in time-domain as additional (hidden) quantization of the input baseband signal, where PWM does not perceive the true input signal but a quantized version of it. This hidden quantization is an inherent property of all digital PWM schemes, and is due to the displacement of switching instants caused by sampling of a digitized pulsed PWM output signal. In other words, the major spectral distortion is entirely due to the hidden quantization of a digital PWM input signal, and if the input signal into the digital PWM were properly quantized, it is expected that no additional aliasing distortion is introduced and the output of digital PWM could become substantially aliasing-free.

In accordance with aspects of the present invention, there is provided a method and a quantizer circuit for converting a discrete-time baseband signal of arbitrary resolution into a discrete-time signal of finite resolution using the digital pulse width modulation (PWM) scheme. There is also provided a transmitter circuit for converting a discrete-time baseband signal of arbitrary resolution into an RF signal with high coding efficiency and high in-band signal-to-noise ratio.

According to an embodiment of the present invention, a noise mitigation quantizer circuit may include a pre-quantizer to generate a first quantized signal having L output signal levels from an input signal of arbitrary resolution, and a digital pulse-width-modulation (PWM) circuit to modulate the first quantized signal using M modulating PWM carriers and according to an over sampling ratio (OSR) of N and generate a second quantized signal having (M+1) output levels, wherein the number M of the modulating carriers is substantially equal to twice L/N (2L/N).

Further, the number of signal levels L and the number of PWM carriers M and the OSR N are respectively indicated by different integers, and L is determined by $$\left\lfloor \frac{MN}{2} \right\rfloor,$$

in which $$\left\lfloor \frac{MN}{2} \right\rfloor$$

denotes the largest integer number smaller or equal to MN/2.

In this case, each of the one or more PWM carrier signals may have a carrier frequency $f_p$ and the PWM circuit operates at the sampling frequency $f_s$, where the oversampling ratio N is expressed by $f_s/f_p$. For example, the OSR N may be greater than unity. Further, when the ratio of $f_s/f_p$ includes a fractional number, the N may be an integer part of $f_s/f_p$.

In some cases, when each of the one or more PWM reference signals is a symmetric reference signal, the pre-quantizer generates a uniformly quantized signal. Further, when at least one of the one or more carriers is an asymmetric reference signal or a constant reference signal, the pre-quantizer generates a non-uniform quantized signal. For instance, the pre-quantizer may be a discrete delta-sigma ($\Delta$-$\Sigma$) modulator or the pre-quantizer may be a pulse position modulator.

Further, the one or more PWM reference signals may be periodic signals based on one-sided (falling or trailing edge) sawtooth signals, double-edge sawtooth signals, or sinusoidal signals. The digital pulse-width-modulation (PWM) circuit is configured to generate an output signal $\tilde{x}[n]$ expressed by $$\tilde{x}[n] = \tilde{a}_Q[n] + \sum_{k=1}^{\lfloor \frac{N}{2} \rfloor} \frac{2\sin(\pi k M \tilde{a}_Q[n])}{MN\sin\left(\frac{\pi k}{N}\right)} \cos\left(\frac{2\pi}{N} kn\right)$$

wherein n is an integer and a $\tilde{a}_Q[n]$ denotes the first quantized input signal.

According to some embodiments of the present invention, an example is provided below regarding a carrier-based (CB) double-edge (DE) amplitude-slicing multilevel (ML) pulse-width modulation system. Further, the model, procedures and mathematical treatments according to embodiments of the present invention may be referred to a method for cancelling nonlinear distortion in PWM sequences. [The method works with other PWM schemes in the present disclosure.]

FIG. 1A is a diagram illustrating an example of a quadrature modulated all-digital transmitter (ADT) 10, according to embodiments of the present invention. The transmitter 10 includes a power encoder 11, a digital modulator 12, a switched-mode power amplifier (SMPA) 13, a bandpass filter 14 and an antenna 15. In this case, the power encoder 11 receives an in-phase (I) part and a quadrature (Q) part of an input baseband signal and outputs an encoded in-phase signal and an encoded quadrature signal to the digital modulator 12, according to embodiments of the present invention. After receiving the encoded I and Q signals, the digital modulator 12 generates and transmits a multi-level digital RF signal according to the predesigned modulation format to the SMPA 13. The SMPA 13 amplifies and outputs the multi-level digital RF signal to the bandpass filter 14. By passing through the bandpass filter 14, the amplified RF signal filtered according to a predetermined band range is transmitted via the antenna 15.

FIG. 1B is a diagram illustrating an example of a burst-mode ADT transmitter 20, according to embodiments of the present invention. The burst-mode ADT transmitter 20 includes a power encoder 21, a digital modulator 22, a switched-mode power amplifier (SMPA) 23, a bandpass filter 24 and an antenna 25. In this case, the power encoder 21 receives the amplitude (a) part of an input baseband signal and outputs an encoded amplitude signal, according to embodiments of the present invention. The encoded amplitude signal and the phase signal are fed into the digital modulator 22. After receiving the phase $\theta$ and encoded a signals, the digital modulator 22 generates and transmits a multi-level RF digital signal according to the predesigned modulation format to the SMPA 23. The SMPA 23 amplifies and outputs the multi-level RF digital signal to the bandpass filter 24. By passing through the bandpass filter 24, the amplified RF signal filtered according to a predetermined band range is transmitted via the antenna 25.

Before describing more details regarding the power encoders in FIG. 1A and FIG. 1B, we will discuss on the output signals of an analog pulse-width modulator (PWM) for examining the dominant sources with respect to noises generated in the analog PMW, We will show an example of generating a 3-level output, and then give analytical formulas for (M+1) output levels, where M is an arbitrary positive integer. By analyzing behavior of the signals processed in the analog PWM, we will derive an advanced noise mitigating scheme of a digital PWM by applying the analytical formulas of the analog PWM to a digital PWM circuit.

FIG. 2A is a block diagram indicating an example of an analog PWM system. It is inidicated that an analog PWM 200 receives an input signal a(t) and generates an output x(t). FIG. 2B is a diagram illustrating an example of time domain waveforms of input and output signals, according to embodiments of the present invention.

Basic operation of a 3-level analog PWM is shown in the figure. An input signal a(t) and carrier signals $c_1(t)$ and $c_2(t)$ are indicated on the upper time axis, the output x(t) is indicated on the lower time axis. The PWM carrier signals $c_1(t)$ and $c_2(t)$ may be referred to as PWM carriers $c_1(t)$ and $c_2(t)$.

Symmetric double-edge sawtooth signals, with peak to peak amplitude of 0.5, are used as baseline carrier signals $c_1(t)$ and $c_2(t)$. Fundamental period and fundamental frequency of this signal are denoted as $T_p$ and $f_p$, respectively. The term 'carrier frequency' may be used interchangeably with 'pulse frequency' or 'reference frequency'. The contiguous carriers $c_1(t)$ and $c_2(t)$ are shifted in phase by half a carrier period, and in amplitude by 0.5. The input signal a(t) is assumed to change much slower than the carriers $c_1(t)$ and $c_2(t)$, and is constrained in amplitude to interval (0,1). The PWM output signal x(t) is produced by comparing amplitudes of the input and carrier signals as follows: at each time instant t the PWM output is equal to 1, 0.5 or 0, if the input signal a(t) is greater than both the carriers $c_1(t)$ and $c_2(t)$, greater than just $c_1(t)$ or neither, respectively. This can be written as $$x(t) = \begin{cases} 1, & a(t) \geq \max\{c_1(t), c_2(t)\} \\ 0.5, & c_1(t) \leq a(t) < c_2(t) \\ 0, & a(t) < \min\{c_1(t), c_2(t)\} \end{cases}.$$

The output signal x(t) is also the lower coordinate in the figure. It is possible to extend this operation to pulsewidth modulators with more than 3 output levels (i.e. more than 2 carriers), and amplitudes constrained to values other than 0.5. Let us now consider analog PWM with (M+1) instead of 3 output levels (this implies that there are M carriers signals),It can be shown that the output x(t) can be expressed as $$x(t) = a(t) + \sum_{k=1}^{\infty} \frac{2}{\pi M k} \sin(\pi M k a(t)) \cos(2\pi k f_p t). \quad (1)$$

Equation (1) can be written as $$x(t) = x_0(t) + \sum_{k=1}^{\infty} x_k(t) \cos(2\pi k f_p t), \quad (2)$$

where $$x_0(t) = a(t), \quad (3)$$

$$x_k(t) = \frac{2}{\pi M k} \sin(\pi M k a(t)), \forall k \in \mathbb{N},$$

It follows from equation (1) that the output of analog PWM system can be described as a sum of the baseband component $x_0(t)$, equal to the input signal $a(t)$, and amplitude modulated harmonics $x_k(t)$ at integer multiples of the PWM carrier frequency $f_p$. It is therefore clear that the output signal $x(t)$ is of infinite bandwidth and sampling such a signal (independent of how large the sampling frequency is) would produce infinite amount of spectral aliasing in the baseband, since every copy of the original spectrum now contributes to the overall level of aliasing.

Similar to the discussion above, we will analyze input and output signals of a digital PWM circuit to derive a noise mitigation scheme. In this case, the digital PWM is described as time-sampled version of analog PWM.

Figure 3:
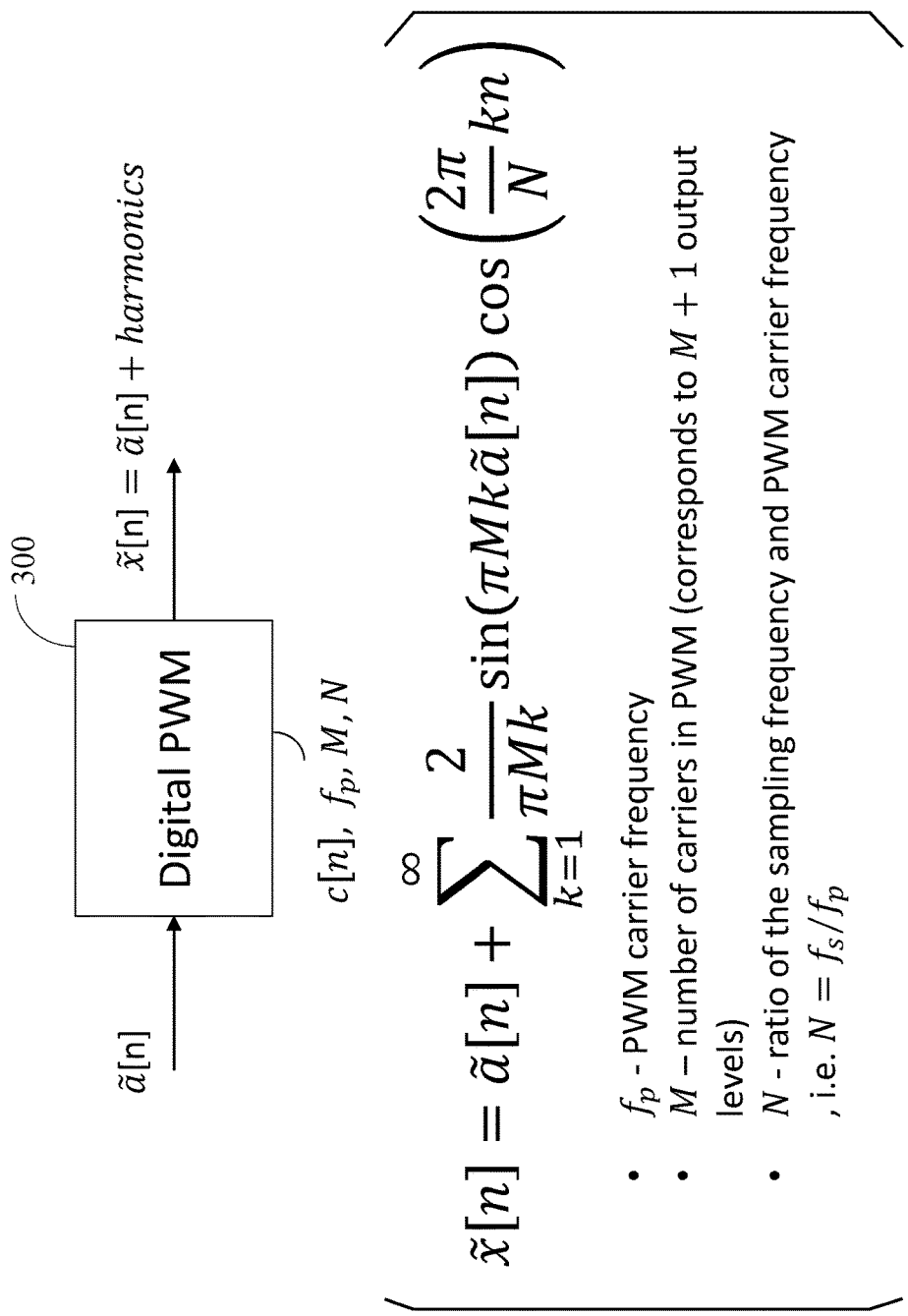
FIG. 3 is a block diagram illustrating an example of a digital PWM system, according to embodiments of the present invention.

FIG. 3 is a block diagram illustrating an example of a digital PWM system 300 according to embodiments of the present invention. Unlike the analog PMW system 200, the input signal ã[n] is different from the baseband continuous-time input signal a(t) of the analog PMW sytem 200. The input signal ã[n] is a discrete-time signal produced by uniformly sampling the input signal a(t) at a sampling frequency $f_s$ (this step is not shown). In this case, the output signal x̃[n] of the digital PWM system 300 is also a discrete-time signal obtained by uniformly sampling the output signal x(t) of the analog PMM system 200 at the sampling frequency $f_s$. The output signal x̃[n] will be discussed below as equation (5). In some cases, the term 'sampling frequency' may be referred to as 'sampling rate.'

In the following, we assume that the sampling frequency $f_s$ of the digital PWM system 300 is expressed by an integer N multiple of the PWM carrier frequency $f_p$. Accordingly, the sampling frequency is expressed by $f_s = N \cdot f_p$, where N is an integer number greater than 1. In some cases, a sampling ratio $f_s/f_p$, can be a non-integer value according to the requirements for the circuit design. In such a case, the value of N takes the interger part of the ratio of $f_s/f_p$, where N is called the oversampling ratio (OSR) of digital PWM. Input and output signals of the digital PWM system 300 are now given as $$ã[n]=a(nT_s), x̃[n]=x(nT_s) \quad (4)$$

where $T_s=1/f_s=1/(N \cdot f_p)$ is the sampling period.

It is derived from equations (1) and (4), that digital PWM output signal x̃[n] can be expressed as $$x̃[n] = a(nT_s) + \sum_{k=1}^{\infty} \frac{2}{\pi M k} \sin(\pi M k a(nT_s)) \cos(k\omega_p nT_s) \quad (5)$$

$$= ã[n] + \sum_{k=1}^{\infty} \frac{2}{\pi M k} \sin(\pi M k ã[n]) \cos\left(\frac{2\pi}{N} k n\right).$$

The sum in equation (5) is an infinite sum, but the number of possibly different harmonics is finite, and equal to N. Moreover, since x̃[n] is a real-valued signal, its Fourier transform is conjugate symmetric, and the number of independent harmonics is equal to $$\left(\left\lfloor \frac{N}{2} \right\rfloor + 1\right)$$

(here $\lfloor \alpha \rfloor$ denotes the largest integer number being smaller or equal to $\alpha$).

Let us define signal ã[n] as follows:

$$ã_A[n] = \frac{2m+1}{MN} \text{ when } \frac{2m}{MN} \le a[n] < \frac{2m+2}{MN},$$

$$m \in \left\{0, \ldots, \left\lfloor \frac{N-1}{2} \right\rfloor\right\}, \text{ for all}$$

It can be seen that signal $ã_Q[n]$ is the uniformly quantized version of the input signal a[n], where this uniform quantization is done over the interval (0, 1) with $$\left\lfloor \frac{MN}{2} \right\rfloor \text{ levels.}$$

After rearranging the infinite sum in (5), and some analytical manipulations, output signal x̃[n] can be expressed as $$x̃[n] = x̃_0[n] + \sum_{k=1}^{\lfloor \frac{N}{2} \rfloor} x̃_k[n] \cos\left(\frac{2\pi}{N} kn\right), \quad (6)$$

where $$x̃_0[n] = ã_Q[n], \quad (7)$$

and $x̃_k$ depends on whether N is even or odd as:

i) N – odd  (8)

$$x̃_k[n] = \frac{2\sin(\pi k M ã_Q[n])}{MN \sin\left(\frac{\pi k}{N}\right)}, 1 \le k \le \left\lfloor \frac{N}{2} \right\rfloor.$$

ii) N – even  (9)

$$x̃_k[n] = \frac{2\sin(\pi k M ã_Q[n])}{MN \sin\left(\frac{\pi k}{N}\right)}, 1 \le k \le \frac{N}{2} - 1,$$

$$x̃_{N/2}[n] = \frac{\sin(\frac{\pi}{2} MN ã_Q[n])}{MN}$$

Here $\tilde{x}_0[n]$ denotes the baseband component of $\tilde{x}[n]$, and $\tilde{x}_k[n]$ are higher order harmonics, similar to the description of the analog PWM output, given in (3). Therefore, a discrete-time equivalent of continuous-time equation (1) can be written as follows $$\tilde{x}[n] = \tilde{a}_Q[n] + \sum_{k=1}^{\lfloor \frac{N}{2} \rfloor} \frac{2\sin(\pi k M \tilde{a}_Q[n])}{MN\sin\left(\frac{\pi k}{N}\right)} \cos\left(\frac{2\pi}{N}kn\right). \quad (10)$$

From equation (10) it can be seen that PWM output signal $\tilde{x}[n]$ does not perceive the true input $\tilde{a}[n]$ but its uniformly quantized version $\tilde{a}_Q[n]$. We will call this phenomenon the hidden quantization. It is important to emphasize that this hidden quantization is an inherent property of all digital PWM schemes. PWM output signal is by definition a pulsed signal (whose Fourier series coefficients are sinc functions) and therefore a formula similar to (10) may hold, regardless of the choice of one or more of PWM carrier signals. Parameters of the quantization process may change in this case, e.g. for trailing edge PWM L=MN may substantially hold, and for sinusoidal carriers quantization process may be non-uniform. Another way of seeing this is by noticing that the hidden quantization is due to the displacement of switching instants caused by sampling of a digitized pulsed PWM output signal. Therefore, the relations (equations) discussed above can be similarly applied to all other digital PWM schemes (single vs double edge, naturally vs uniformly sampled, carrier-based vs threshold-based, sinusoid vs sawtooth carriers, etc.

As previously noted, the signal x(t) has infinite bandwidth, and thus aliasing occurs after obtaining the output signal $\tilde{x}[n]$ from the signal x(t) by the sampling process.

Figure 4A:
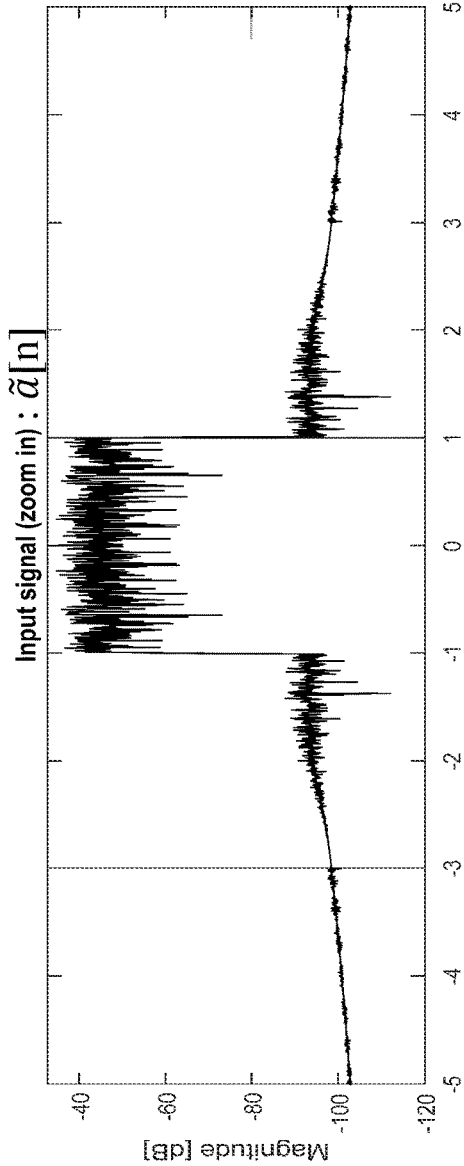
FIG. 4A is a diagram illustrating an example of spectra of a digital PWM input baseband signal, according to embodiments of the present invention.

FIG. 4A is a diagram illustrating an example of a spectrum of a 20 MHz bandwidth input baseband signal $\tilde{a}[n]$ transmitted to the digital PWM 300. It indicates that a reasonably low noise signal with a sufficient signal-to-noise ratio (SNR) is introduced to the digital PWM 300 as the input signal.

Figure 4B:
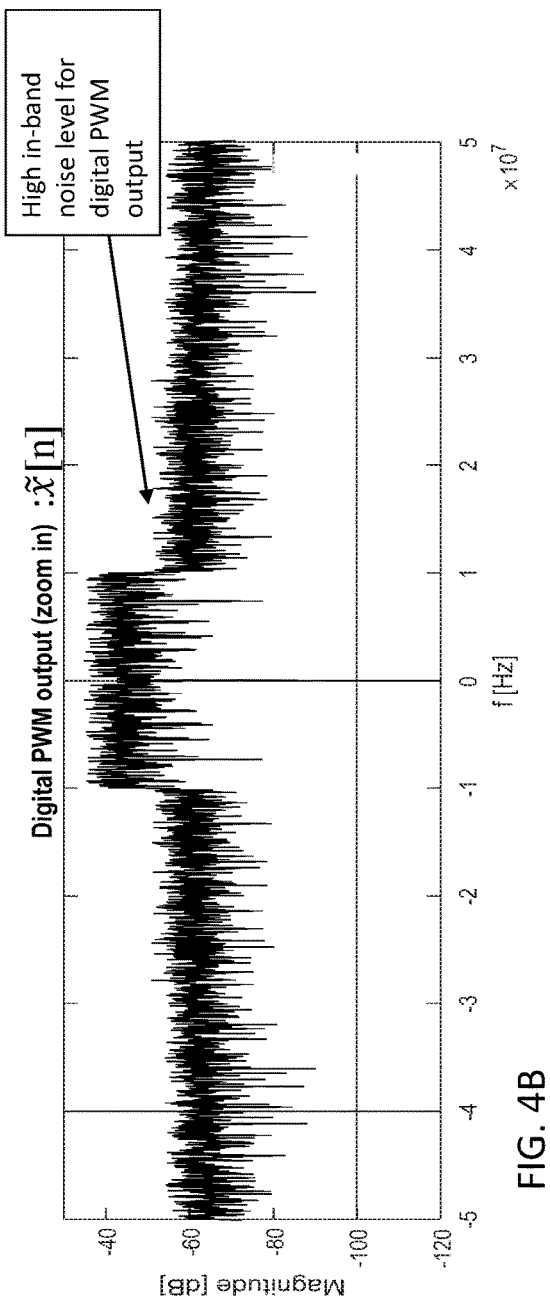
FIG. 4B is a diagram illustrating an example of spectra of a digital PWM output signal, according to embodiments of the present invention.

FIG. 4B is a diagram illustrating an example of spectra of an output signal $\tilde{x}[n]$ transmitted from the digital PWM 300. In this case, the output signal $\tilde{x}[n]$ is given by equation (5).

The parameters and signal conditions exemplary used in the simulation are as follows. Input signal $\tilde{a}[n]$, obtained by sampling a baseband signal a(t) of bandwidth 20 MHz, with dynamic range of about 55 dB is fed into digital pulse width modulator, with RF frequency $f_c=2$ GHz, M+1=5 output levels, and OSR equal to N=4 (thus the sampling rate is $f_s=N \cdot f_c=8$ GHz).

As can be seen in the figure, an anomalous amount of aliasing occurred in the baseband portion of the signal $\tilde{x}[n]$, which should be occupied by $\tilde{a}[n]$. As can be seen from the spectral plot in which the low frequency interval (−50 MHz, 50 MHz) is zoomed in, the baseband component of $\tilde{x}[n]$ has degraded dynamic range of about 25 dB, which is due to the hidden quantization process applied on signal $\tilde{a}[n]$. Communication standards put very stringent requirements on allowable output dynamic range, which are on the order of 50-60 dB. Clearly using plain digital PWM system to reduce resolution of a PA driving signal can hardly achieve those requirements, especially in high power applications when hardware specifications give relatively low upper bounds on parameters M and N.

Intuitively it is clear that increasing the sampling rate and/or number of levels in PWM, the linearity performance increases, due to either less aliasing effects (higher sampling rate) or better amplitude resolution of the signal (more output levels in digital PWM). One of approaches is, in order to use the digital PWM 300 as a power coder in all-digital transmitters, that the sampling frequency is set to be orders of magnitude larger than the carrier frequency of PWM.

The simulation result indicates the high levels of in-band distortion are introduced by aliasing if the ratio $N=f_s/f_p$ is too small (where it is assumed that the number of output levels of pulse width modulator is relatively small due to hardware constraints). Generally, this is true if signal taking arbitrary values in the interval (0,1) is to be fed into the digital PWM 300.

Let us now look at this problem with the result from equation (10) in mind It turns out that the aliasing effects in frequency-domain are due to sampling in time and manifested as hidden quantization in time-domain. Therefore, a major portion of the baseband distortion is entirely due to hidden quantization of the digital PWM input signal $\tilde{a}[n]$. This implies that if the input signal $\tilde{a}[n]$ into the digital PWM 300 was already quantized, it would be possible to achieve the output of digital PWM $\tilde{x}[n]$ with no additional distortion introduced by the hidden quantization. In other words, the output of digital PWM $\tilde{x}[n]$ would become truly aliasing-free. It is important to emphasize that no aliasing will occur if amplitudes of the input signal $\tilde{a}[n]$ into the digital PWM 300 correspond to output values of a uniform quantizer with the number of levels exactly matching that from hidden quantization. But pre-quantization of the high resolution true input signal would introduce distortion itself, with or without the digital PWM, thus possibly diminishing the gain of aliasing-free digital PWM. But now we have control over this quantization process, modulo uniformity and the number of quantization levels (which are both specified by the parameters of digital PWM system). Hence quantization noise can be shaped to the out-of-band region with e.g. a delta-sigma modulator (DSM) or a pulse position modulator (PPM), or any other noise shaping quantizer, controlling in-band distortion of the digital PWM output $\tilde{x}[n]$. This implies that power encoding with a specially designed noise shaping quantizer followed by digital PWM can achieve very high level of linearity.

According to embodiments of the present invention, a distortion mitigation quantizer including a series connection of a DSM and a digital PWM provides digital signal outputs, unlike the circuit consisting of a series connection of DSM and analog PWM which outputs a continuous-time signal. In other words, the digital PWM according to the present invention plays a role as a map between discrete-time signals.

Therefore, all distortion that is under consideration in such applications is either due to inherent nonlinear transformation from input signal samples to pulsed output duty-cycles, or from hardware resolution constraints. In digital PWM, distortion is mainly generated by sampling and corresponding spectral aliasing, as described in detail in this section. Although these two PWM schemes both employ DSM with the same motivation: to reduce resolution of the true input signal and control the quantization error, so that limitations of the PWM system do not manifest in the output in terms of additional in-band distortion, they rely on fundamentally different operation.

Figure 5:
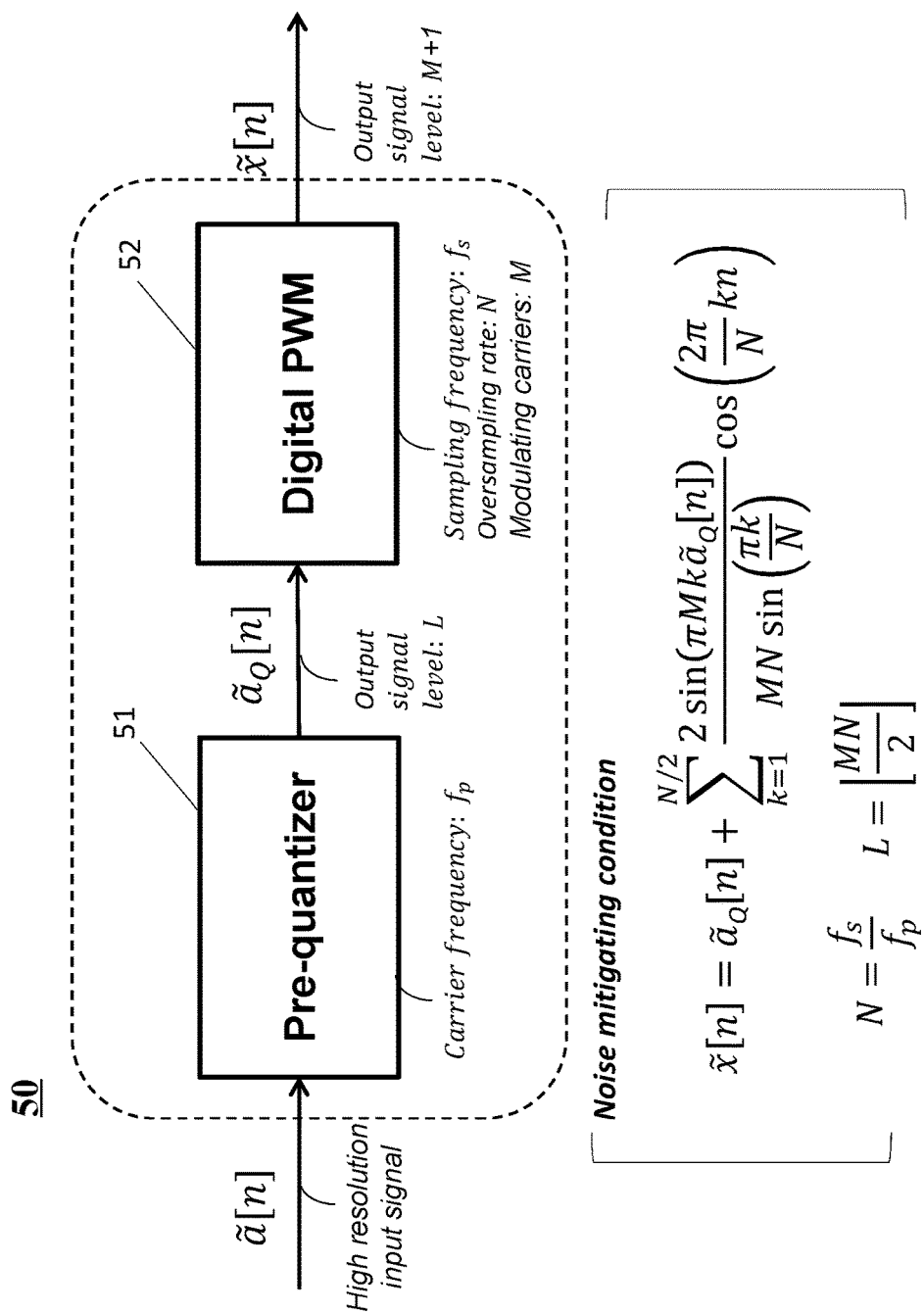
FIG. 5 is a block diagram illustrating a pre-quantizer integrated digital PWM system, according to embodiments of the present invention.

FIG. 5 is a block diagram illustrating a pre-quantizer integrated digital PWM system 50, according to embodiments of the present invention. The pre-quantizer integrated digital PWM system 50 may include a pre-quantizer 51 and a digital PWM circuit 52. In some cases, the pre-quantizer 51 and the digital PWM circuit 52 may be separately configured as different digital signal circuits, in which the pre-quantizer 51 and the digital PWM circuit 52 are configured in series connection. Further, the integrated digital PWM system 50 can be formed by a signal processing circuit known in the art by introducing algorithms based on the noise mitigating condition. For instance, see FIG. 5 and FIG. 8 and the corresponding discussions in the present disclosure. The integrated digital PWM system 50 is used for cancelling spectral distortions in digital PWM signals. For instance, when the digital PWM device 52 is configured to have M +1 =5 output levels (i.e. M=4 carriers), carrier frequency $f_p$=2 GHz, and oversampling ratio of N=4 can be used. (same as in the case of FIG. 3B). In order to reduce spectral distortions in the output signal x̃[n], a delta-sigma modulator is used as a pre-quantizer and the number of output levels of the delta-sigma modulator should be equal to $$L = \left\lfloor \frac{MN}{2} \right\rfloor = 8. \tag{11}$$

Figure 6A:
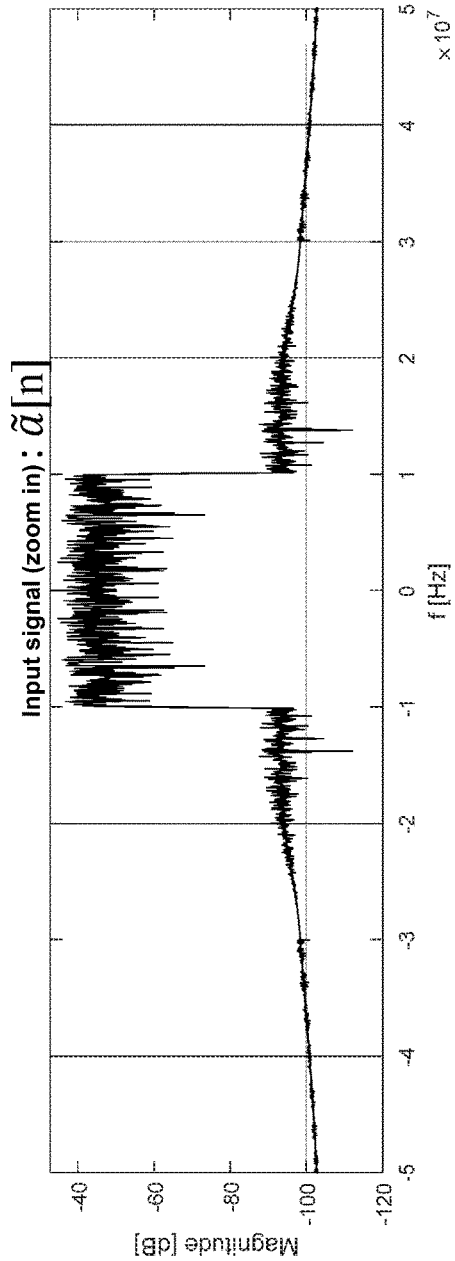
FIG. 6A is a diagram illustrating an example of spectra of a pre-quantizer baseband input signal, according to embodiments of the present invention.

FIG. 6A is a diagram illustrating an example of spectra of an input signal transmitted to the pre-quantizer 51 for comparison with the digital PWM 300, in which the input signal is identical to the input signal of FIG. 4B.

Figure 6B:
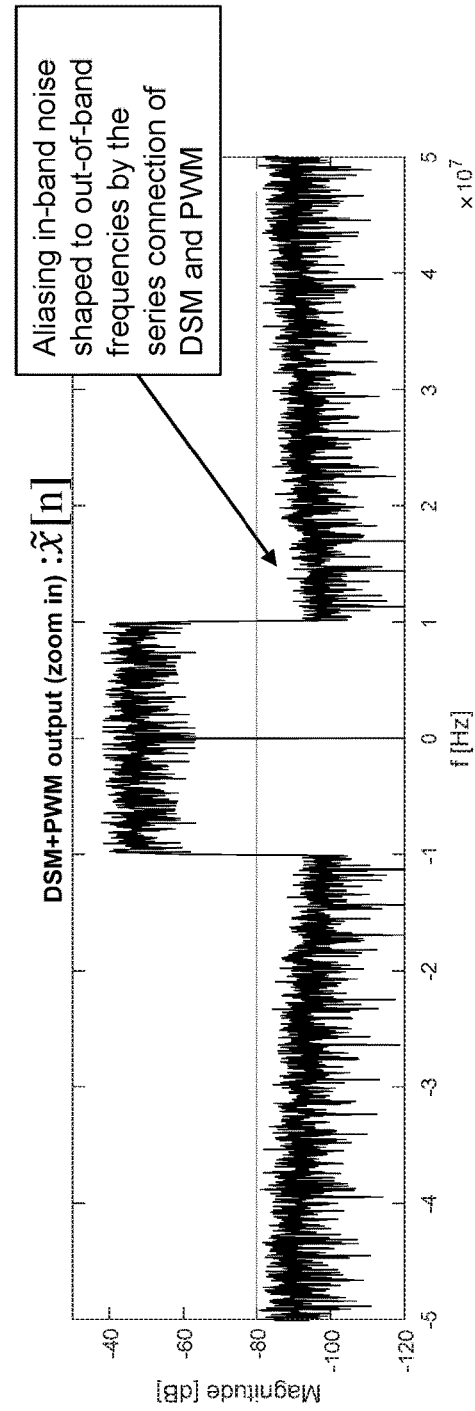
FIG. 6B is a diagram illustrating example spectra of the output signal x̃[n] of a pre-quantizer integrated digital PWM system, according to embodiments of the present invention.

FIG. 6B is a diagram illustrating an example of spectra of the output signal x̃[n] of a pre-quantizer integrated digital PWM system, according to embodiments of the present invention.

FIG. 6B shows spectra of the output signal x̃[n] of the system whose block diagram is depicted in FIG. 5, for the above defined parameters of the pre-quantizer 51 and the digital PWM 52. The input signal â[n] used to excite the pre-quantizer integrated digital PWM system 50 is the same input as the example of FIG. 3B. As can be seen, the baseband part of signal x̃[n] has very high dynamic range (around 50 dB), equal to that of DSM output signal x̃[n], which would not be achieved for any other choice of the number of output levels of DSM.

Figure 7:
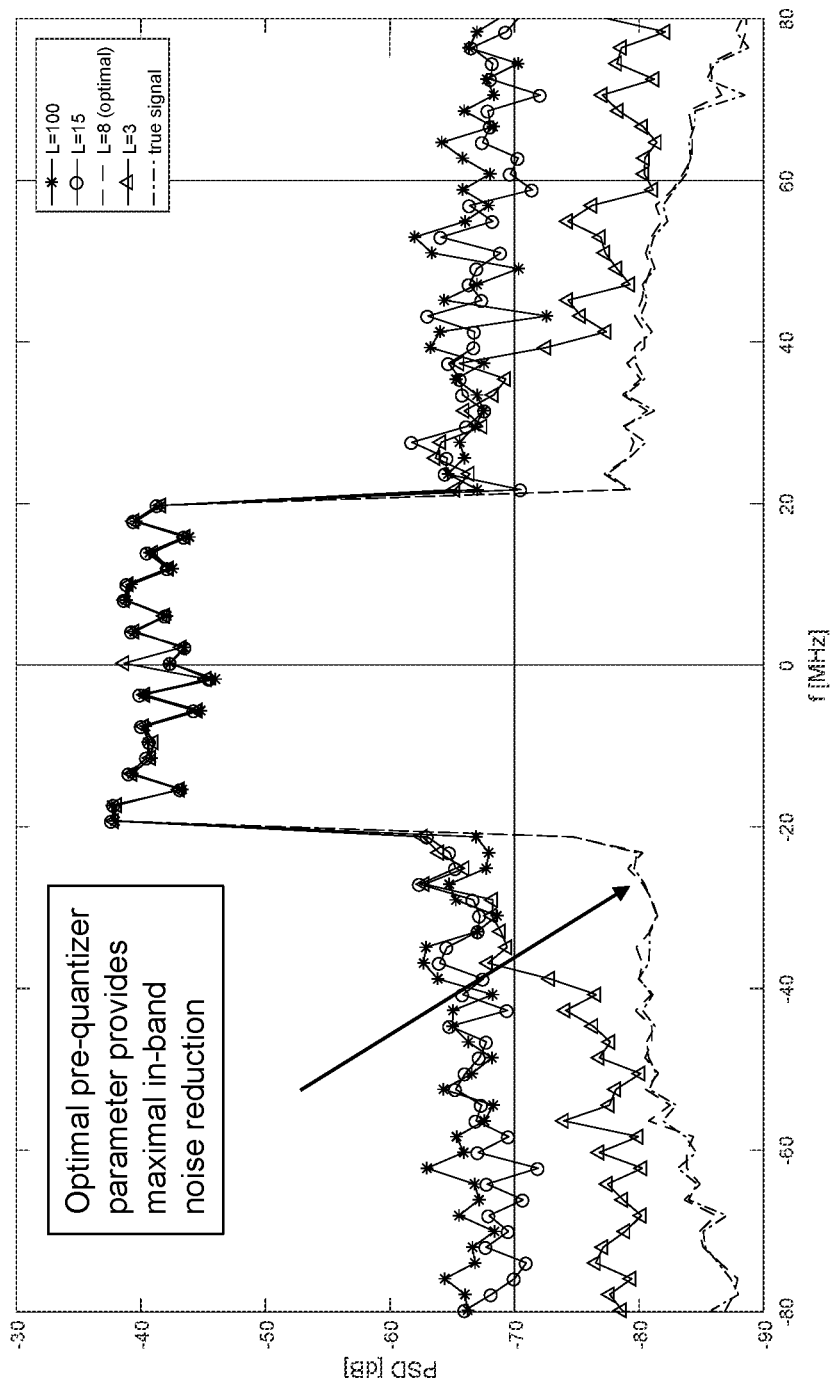
FIG. 7 is a diagram illustrating various levels of in-band noise in the spectrum of the output signal x̃[n] of a pre-quantizer integrated digital PWM system for different choices of pre-quantizer output signal level L, according to embodiments of the present invention.

FIG. 7 is a diagram illustrating spectra of in-band noise levels for different output signal level L of the pre-quantizer 51. In this case, the output signal level L is varied by L=3, 8, 15 and 100. It is noted that the in-band distortion is lowest at L=8. This indicates that the in-band distortion is minimized when the pre-quantizer parameter is optimized. In other words, by the right choice of parameters of DSM and PWM systems, it is possible to produce a low resolution PWM sequence without sacrificing dynamic range.

Figure 8:
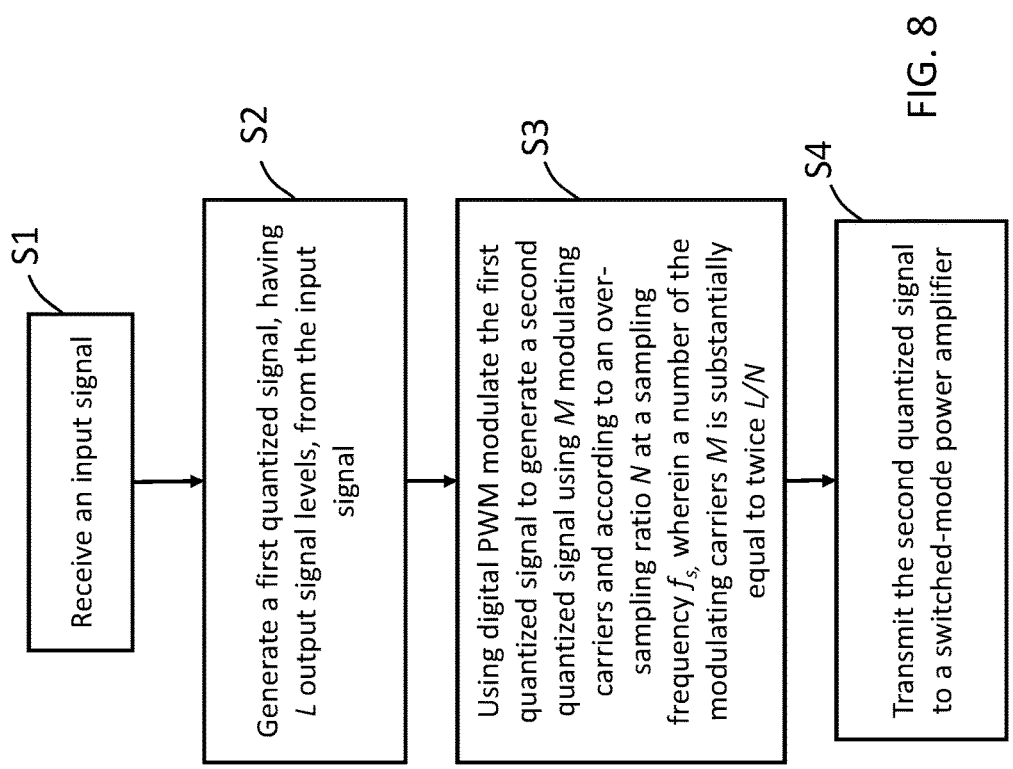
FIG. 8 is a diagram indicating a noise mitigating method for reducing noise of digital transmission, according to embodiments of the present invention.

FIG. 8 is a diagram indicating a noise mitigating method for reducing noise of digital transmission, according to embodiments of the present invention. The noise mitigating method 80 can be performed by use of the pre-quantizer 51 and the digital PWM circuit 52 of the pre-quantizer integrated digital PWM system 50 indicated in FIG. 5. The pre-quantizer 51 receives an input signal in step S1 via an input interface (not shown) of the pre-quantizer 51, and generates a first quantized signal having L output signal levels from an input signal in step S2. The first quantized signal is transmitted to the digital PWM circuit 52 in step S3, and the digital PWM circuit 52 generates a second quantized signal using M modulating carriers with PWM carrier frequency $f_p$ according to an over-sampling ratio N at a sampling frequency $f_s$. In some cases, the sampling frequency $f_s$ may be referred to as a sampling rate $f_s$. In this case, the number of output signal levels of the digital PWM circuit 52 is M+1. It is noted that the pre-quantizer integrated digital PWM system 50 is configured such that the relations of the number of modulating carriers M, the over-sampling ratio N and the output signal levels L are expressed by $$L = \left\lfloor \frac{MN}{2} \right\rfloor.$$

It is also noted that these quantization levels may correspond to uniformly quantizing the input signal dynamic range. The second quantized signal is transmitted to a switched-mode power amplifier (not shown in FIG. 5) in step S4.

Further, the noise mitigating method 80 can be stored as a noise mitigating program into a memory connected to a digital signal processor (not shown), and the digital signal processor can implement the noise mitigating program to mitigate digital signal noise of the pre-quantizer integrated digital PWM system 50, according to the steps of the method 80.

Figure 9:
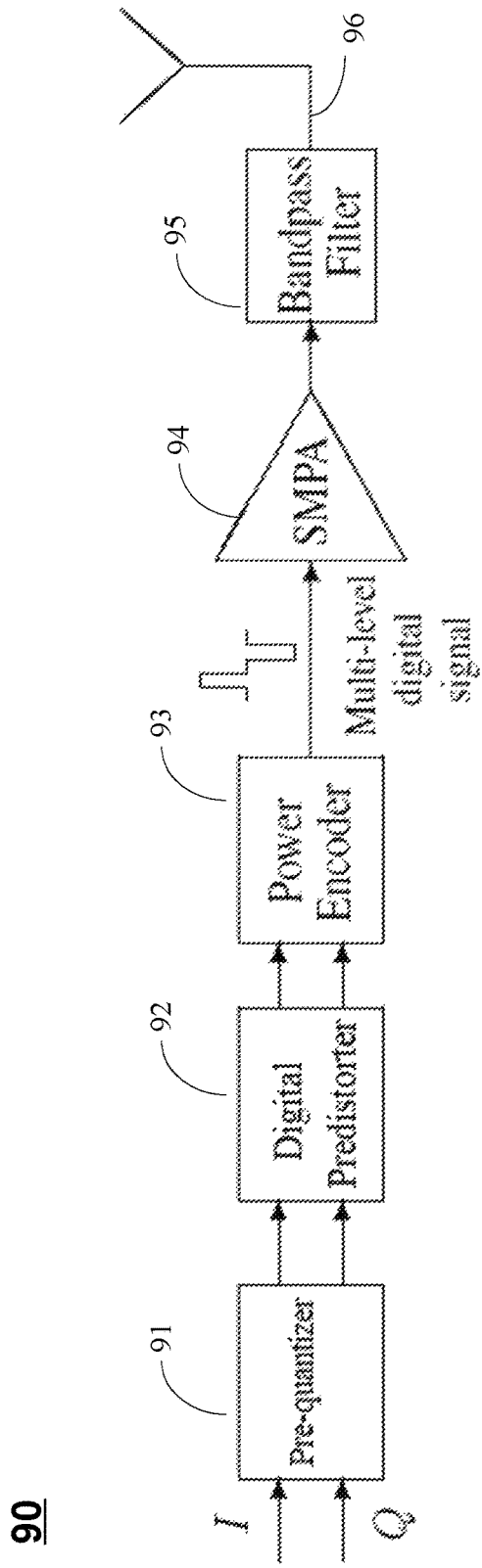
FIG. 9 is a diagram illustrating an example of an all-digital transmitter based on
according to embodiments of the present invention.

FIG. 9 shows an example of an all-digital transmitter 90 according to an embodiment of the present invention. The all-digital transmitter 90 includes a pre-quantizer 91, a digital predistorter 92, a power encoder 93, an SMPA 94, a bandpass filter 95 and an antenna 96. An input inphase signal I and a quadrature signal Q are firstly pre-quantized by the pre-quantizer 91 (e.g. Delta-sigma modulator), then the digital predistorter 92 pre-distorts the outputs of the pre-quantizer 91 to improve signal linearity performance. Further, the power encoder 93 performs the power encoding as discussed above to generate multi-level digital signals. These multi-level digital signals are used as driver to drive the SMPA (swith-mode power amplifeir) 94. The bandpass filter 95 is used to reconstruct an analog signal from the digital signal amplified by the SMPA 94. The reconstructed analog signal is transmitted from the antenna 96 to the air interface for wireless communications.

The above-described embodiments of the present invention can be implemented in any of numerous ways. For example, the embodiments may be implemented using hardware, software or a combination thereof When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

We claim:

1. A distortion mitigation quantizer circuit, comprising:
   a pre-quantizer to generate a first quantized signal having L output signal levels from an input signal; and
   a digital pulse-width-modulation (PWM) circuit to modulate the first quantized signal using M modulating carriers with PWM carrier frequency $f_p$ and according to an over sampling ratio (OSR) N in order to generate a second quantized signal, wherein a number of the modulating carriers M is substantially equal to twice L/N, wherein L, N and M are positive integers.

2. The quantizer circuit of claim 1, wherein each of the one or more carrier signals has a carrier frequency $f_p$ and the PWM circuit samples the first quantized signal by a sampling frequency $f_s$, and the over sampling ratio N is expressed by $f_s/f_p$.

3. The quantizer circuit of claim 1, wherein when each of the one or more carriers is a symmetric sawtooth carrier signal, the pre-quantizer generates a uniformly quantized signal.

4. The quantizer circuit of claim 1, wherein when each of the one or more carriers is an asymmetric sawtooth carrier signal, the pre-quantizer generates a non-uniformly quantized signal.

5. The quantizer circuit of claim 1, wherein the pre-quantizer is a discrete delta-sigma ($\Delta$-$\Sigma$) modulator.

6. The quantizer circuit of claim 1, wherein the pre-quantizer is a pulse position modulator.

7. The quantizer circuit of claim 1, wherein the N is greater than unity.

8. The quantizer circuit of claim 1, wherein the N corresponds to an integer part of $f_s/f_p$.

9. The quantizer circuit of claim 1, wherein the one or more carrier signals are periodic signals based on one-side sawtooth signals, double-edge sawtooth signals, or sinusoidal signals.

10. The quantizer circuit of claim 1, wherein the digital pulse-width-modulation (PWM) circuit generates an output signal $\tilde{x}[n]$ expressed by $$\tilde{x}[n] = \tilde{a}_Q[n] + \sum_{k=1}^{\lfloor \frac{N}{2} \rfloor} \frac{2\sin(\pi k M \tilde{a}_Q[n])}{MN\sin\left(\frac{\pi k}{N}\right)} \cos\left(\frac{2\pi}{N}kn\right)$$

wherein n is an integer and $\tilde{a}_Q[n]$ denotes the first quantized input signal, wherein k is a positive integer.

11. A method for mitigating distortion noises of a digital signal transmission, comprising steps of:
    generating a first quantized signal having L output signal levels from an input signal; and
    modulating the first quantized signal using M modulating carriers with PWM carrier frequency $f_p$ according to an over sampling ratio (OSR) N in order to generate a second quantized signal, wherein a number of the modulating carriers M is substantially equal to twice L/N, wherein L, N and M are positive integers.

12. The method of claim 11, wherein the digital pulse-width-modulation (PWM) process generates an output $\tilde{x}[n]$ expressed by $$\tilde{x}[n] = \tilde{a}_Q[n] + \sum_{k=1}^{\lfloor \frac{N}{2} \rfloor} \frac{2\sin(\pi k M \tilde{a}_Q[n])}{MN\sin\left(\frac{\pi k}{N}\right)} \cos\left(\frac{2\pi}{N}kn\right)$$

wherein n is an integer and $\tilde{a}_Q[n]$ denotes the first quantized input signal, wherein k is a positive integer.

13. The method of claim 11, wherein when each of the one or more carriers is a symmetric sawtooth carrier signal, the pre-quantizer generates a uniformly quantized signal.

14. The method of claim 11, wherein when each of the one or more carriers is an asymmetric sawtooth carrier signal, the pre-quantizer generates a non-uniformly quantized signal.

15. The method of claim 11, wherein the pre-quantizer is a discrete delta-sigma ($\Delta$-$\Sigma$) modulator.

16. A digital transmitter comprising:
    a power encoder to generate an input signal from input-data having in-phase and quadrature components of the input signal or magnitude of the input signal;
    a pre-quantizer to generate a first quantized signal having L output signal levels;
    a digital pulse-width-modulation (PWM) circuit to modulate the first quantized signal using M modulating carriers with PWM carrier frequency $f_p$ and according to an over sampling ratio (OSR) N in order to generate a second quantized signal, wherein a number of the modulating carriers M is substantially equal to twice L/N, wherein L, N and M are positive integers;
    a digital modulator to upconvert the second quantized signal to RF frequency;
    a switching mode power amplifier to amplify the upconverted second quantized signal;
    a bandpass filter to process the amplified upconverted second quantized signal; and
    an antenna to transmit the processed amplified upconverted second quantized signal.

17. The digital transmitter of claim 16, wherein the digital pulse-width-modulation (PWM) circuit generates an output signal $\tilde{x}[n]$ expressed by $$\tilde{x}[n] = \tilde{a}_Q[n] + \sum_{k=1}^{\lfloor \frac{N}{2} \rfloor} \frac{2\sin(\pi k M \tilde{a}_Q[n])}{MN\sin\left(\frac{\pi k}{N}\right)} \cos\left(\frac{2\pi}{N}kn\right)$$

wherein n is an integer and $\tilde{a}_Q[n]$ denotes the first quantized input signal, wherein k is a positive integer.

18. The digital transmitter of claim 16, wherein when each of the one or more carriers is a symmetric sawtooth carrier signal, the pre-quantizer generates a uniformly quantized signal.

19. The digital transmitter of claim 16, wherein when each of the one or more carriers is an asymmetric sawtooth carrier signal, the pre-quantizer generates a non-uniformly quantized signal.

20. The digital transmitter of claim 16, wherein the one or more carrier signals are periodic signals based on one-side sawtooth signals, double-edge sawtooth signals, or sinusoidal signals.

* * * * *